(12) United States Patent
Maeda et al.

(10) Patent No.: US 7,477,537 B2
(45) Date of Patent: *Jan. 13, 2009

(54) SEMICONDUCTOR INTEGRATED CIRCUIT DEVICE

(75) Inventors: Noriaki Maeda, Higashiyamato (JP);
Yoshihiro Shinozaki, Fukuoka (JP);
Masanao Yamaoka, Jyosui (JP);
Yasuhisa Shimazaki, Kodaira (JP);
Masanori Isoda, Sayama (JP); Koji Nii, Kawanishi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/504,079

(22) Filed: Aug. 15, 2006

(65) Prior Publication Data

US 2006/0274572 A1    Dec. 7, 2006

Related U.S. Application Data

(63) Continuation of application No. 11/127,286, filed on May 12, 2005, now Pat. No. 7,113,421.

(30) Foreign Application Priority Data

Sep. 15, 2004    (JP)    ............................. 2004-267645

(51) Int. Cl.
G11C 11/00    (2006.01)
(52) U.S. Cl. .................. 365/154; 365/230.06; 365/203; 365/226
(58) Field of Classification Search .................. 365/154, 365/230.06, 203, 156, 226
See application file for complete search history.

(56) References Cited

U.S. PATENT DOCUMENTS

| 5,544,123 | A | * | 8/1996 | Hoshi et al. | ............. | 365/230.06 |
| 5,668,770 | A | * | 9/1997 | Itoh et al. | .................... | 365/227 |
| 6,414,535 | B1 | | 7/2002 | Ooishi | | |
| 6,643,173 | B2 | | 11/2003 | Takemura | | |
| 6,798,688 | B2 | | 9/2004 | Joshi | | |
| 6,903,962 | B2 | | 6/2005 | Nii | | |
| 7,113,421 | B2 | * | 9/2006 | Maeda et al. | ................ | 365/154 |
| 2003/0076705 | A1 | | 4/2003 | Yamaoka et al. | | |

FOREIGN PATENT DOCUMENTS

| JP | 60-038796 | 8/1983 |
| JP | 02-108297 | 10/1988 |
| JP | 2002-042476 | 7/2000 |
| JP | 2004-362695 | 6/2003 |

* cited by examiner

Primary Examiner—Huan Hoang
(74) Attorney, Agent, or Firm—Reed Smith LLP; Stanley P. Fisher, Esq.; Juan Carlos A. Marquez, Esq.

(57) ABSTRACT

The invention provides a semiconductor integrated circuit device provided with an SRAM that satisfies the requirements for both the SNM and the write margin with a low supply voltage. The semiconductor integrated circuit device include: multiple static memory cells provided in correspondence with multiple word lines and multiple complimentary bit lines; multiple memory cell power supply lines that each supply an operational voltage to each of the multiple memory cells connected to the multiple complimentary bit lines each; multiple power supply circuits comprised of resistive units that each supply a power supply voltage to the memory cell power supply lines each; and a pre-charge circuit that supplies a pre-charge voltage corresponding to the power supply voltage to the complimentary bit lines, wherein the memory cell power supply lines are made to have coupling capacitances to thereby transmit a write signal on corresponding complimentary bit lines.

4 Claims, 13 Drawing Sheets

SEMICONDUCTOR INTEGRATED CIRCUIT DEVICE

CROSS-REFERENCE TO RELATED APPLICATION

This application is a Continuation application of U.S. application Ser. No. 11/127,286 filed May 12, 2005 now U.S. Pat. No. 7,113,421. Priority is claimed based on U.S. application Ser. No. 11/127,286 filed May 12, 2005, which claims the priority of Japanese Patent Application No. 2004-267645 filed Sep. 15, 2004, all of which is incorporated by reference.

BACKGROUND OF THE INVENTION

The present invention relates to a semiconductor integrated circuit device, specifically to a technique effective in use for a semiconductor integrated circuit device provided with a static random access memory.

As one of the parameters for evaluating the memory cells of a static random access memory (hereunder, simply referred to as SRAM), the static noise margin (hereunder, simply referred to as SNM) is generally used. The SNM indicates the stability of data stored in the memory cells. As the value of the SNM becomes increased, the data retaining operation of the memory cells becomes more stabilized; on the contrary however, the writing of inverse data to the retained data stored in the memory cells becomes difficult. The Japanese Unexamined Patent Publication No. 2002-042476 is disclosed as a technique for solving such a problem. The inventors of this application examined the circuit construction of the SRAM on the basis of the above publication. FIG. 17 illustrates the block diagram of the SRAM. The technique of this publication uses a voltage supply circuit as shown in FIG. 18 for reading data, brings a signal WEi into Low level to activate a P-channel MOSFET, and supplies the memory cells with the same level voltage as an external supply voltage Vcc, thus intending to secure a stable driving. In the write operation, the technique brings the signal WEi into High level to deactivate the P-channel MOSFET and activate an N-channel MOSFET instead, and lowers the internal supply voltage supplied to the memory cells to Vcc-Vth. Thereby, this technique lowers the SNM of the memory cells selected by the word lines and enhances the write margin.

Patent Document 1: Japanese Unexamined Patent Publication No. 2002-042476

SUMMARY OF THE INVENTION

The technique of the Patent Document 1 involves lowering the internal supply voltage supplied to the memory cells of which the word lines selected by the row decoder are activated, which are not selected by the column decoder, and it also involves the danger of disappearing data because of the influences of noises in the read-out state of the lowered SNM. In order to avoid such danger, the technique of the patent document 1 provides an external supply voltage control circuit as shown in FIG. 19, which sets a lower limit voltage, and discriminates the lower limit voltage to thereby restrain the SNM of the non-selected memory cells from being lowered. However, to generate such a lower limit voltage, the technique needs to provide an intermediate supply voltage generator inside the memory. This provision of the intermediate supply voltage generator increases the current consumption of the memory circuit, and the lower limit voltage restrains the lowering of the SNM, thus leading to incapability of enhancing the write margin. Especially in the LSI (Large Scale Integrated Circuit), the trend for low power consumption and the trend for micro-structuring the MOSFETs inside the LSI will lower the supply voltage, and the difference between the lower limit voltage and the supply voltage becomes very small. Under these circumstances, the technique of the patent document 1 precedes the SNM as the memory circuit, which will face an impossibility of enhancing the write margin.

Therefore, it is an object of the present invention to provide a semiconductor integrated circuit device provided with an SRAM that satisfies the requirements for both the SNM and the write margin with a low supply voltage. The foregoing and other objects and novel features of this invention will become apparent from the descriptions and appended drawings of this specification.

According to an aspect of the invention, the semiconductor integrated circuit device include: multiple static memory cells provided in correspondence with multiple word lines and multiple complimentary bit lines, multiple memory cell power supply lines that each supply an operational voltage to each of the multiple memory cells connected to the multiple complimentary bit lines each, multiple power supply circuits comprised of resistive units that each supply a power supply voltage to the memory cell power supply lines each, and a pre-charge circuit that supplies a pre-charge voltage corresponding to the power supply voltage to the complimentary bit lines, wherein the memory cell power supply lines are made to have coupling capacitances to thereby transmit a write signal on corresponding complimentary bit lines.

According to another aspect of the invention, the semiconductor integrated circuit device includes: multiple static memory cells provided in correspondence with multiple word lines and multiple complimentary bit lines, multiple memory cell power supply lines that each supply an operational voltage to each of the multiple memory cells connected to the multiple complimentary bit lines each, and multiple power supply circuits each made of switch MOSFETs in correspondence with the memory cell power supply lines, which are made OFF during the write operation.

Provided with the above construction, the invention achieves enhancing the write margin to the memory cells corresponding to the selected complimentary bit lines, and it also achieves securing the SNM to the non-selected memory cells connected to the non-selected complimentary bit lines.

DETAILED DESCRIPTION OF THE PREFERRED EMBODIMENTS

Figure 1:
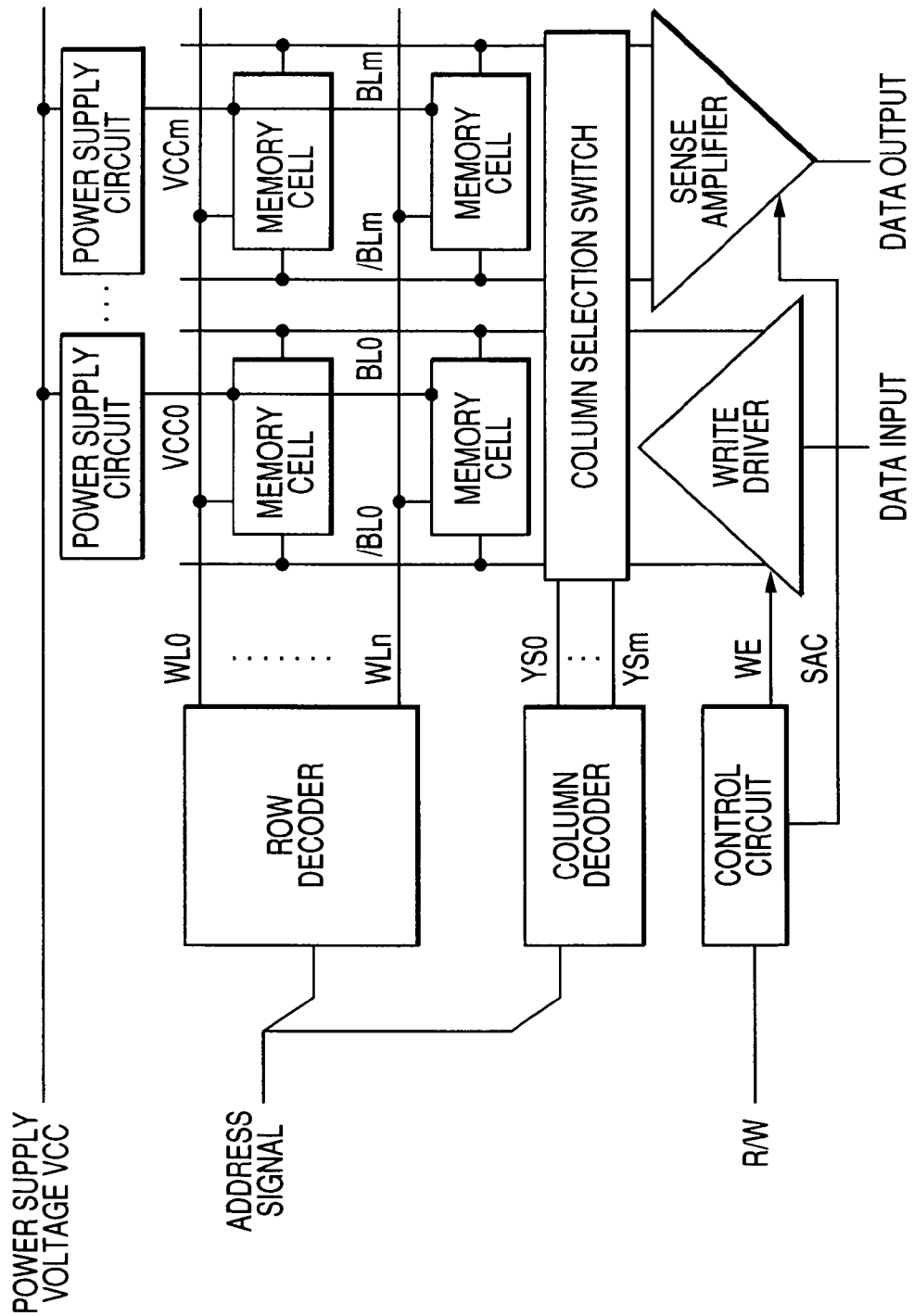
FIG. 1 is a block diagram illustrating one embodiment of an SRAM relating to this invention.

FIG. 1 illustrates a circuit configuration of the SRAM as one embodiment relating to this invention. The drawing typically illustrates four memory cells, and two word lines WL0 and WLn and complimentary bit lines /BL0, BL0 and /BLm, BLm, which corresponds to the four memory cells. The memory cell, which is not illustrated here, includes two CMOS inverters composed of P-channel MOSFETs and N-channel MOSFETs, of which inputs and outputs are cross-connected to form a latch circuit as a memory unit and mutually connected input/output points are used as the memory nodes, and N-channel MOSFETs for address selection, which are provided between the corresponding bit lines /BL and BL. The gates of the MOSFETs for address selection are connected to the corresponding word lines.

One of the word lines WL0 through WLn is selected by a row decoder. The row decoder includes a word driver, which will be described later. The row decoder is supplied with the row-system address signals of the address signal. One pair of plural complimentary bit lines /BL0, BL0 through /BLm, BLm is connected to a write driver or a sense amplifier through a column selection switch. The column selection switch, receiving selection signals YS0 through YSm generated by a column decoder, selects one pair of the plural complimentary bit lines /BL0, BL0 through /BLm, BLm, and makes the one pair connect to the output terminals of the write driver and to the input terminals of the sense amplifier.

A control circuit is supplied with a read/write control signal R/W. The control circuit generates a write signal WE or a sense amplifier control signal SAC as a read-out signal, in correspondence with the read/write signal R/W. The write signal WE is supplied to the write driver, and is used for activating the write driver. Thus, one of the word lines is selected by the row decoder, and one pair of the complimentary bit lines is selected by the column decoder through the column selection switch; and after the write driver is activated, the data input signal is written into the memory cell coupled with the selected word line and the selected complimentary bit lines. The sense amplifier control signal SAC is used for activating the sense amplifier. In the same manner as the above, one of the word lines is selected by the row decoder, and one pair of the complimentary bit lines is selected by the column decoder through the column selection switch; and after the sense amplifier is activated, a read-out signal from the memory cell coupled with the selected word line and the selected complimentary bit lines is transmitted to the sense amplifier. The sense amplifier amplifies the read-out signal and outputs the amplified read-out signal as a data output.

This embodiment further includes memory cell power supply lines VCC0 through VCCm in correspondence with the complimentary bit lines /BL0, BL0 through /BLm, BLm, in order to enhance the write margin of the memory cell corresponding to the selected complimentary bit lines as well as secure the SNM of the non-selected memory cells connected to the non-selected complimentary bit lines. The typically illustrated memory cell power supply line VCC0 is the power supply line to the memory cell connected to the corresponding complimentary bit lines /BL0, BL0. In the same manner, the typically illustrated memory cell power supply line VCCm is the power supply line to the memory cell connected to the corresponding complimentary bit lines /BLm, BLm. Power supply circuits 0 through m are provided between the power supply VCC and the memory cell power supply lines VCC0 through VCCm.

Figure 2:
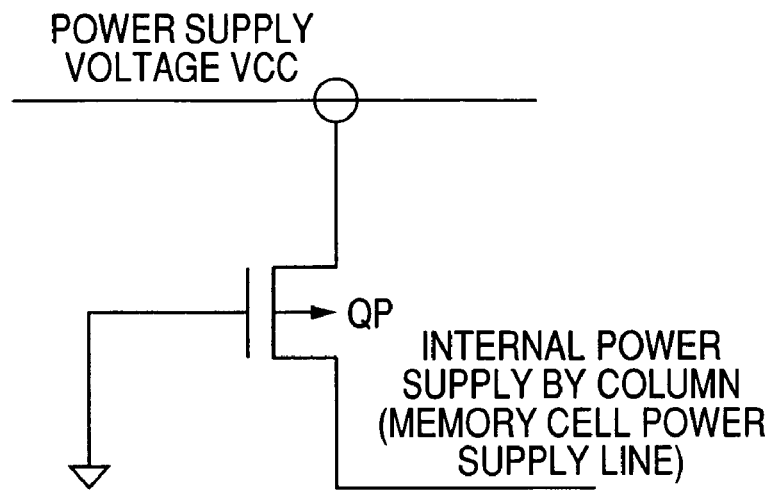
FIG. 2 is a circuit diagram illustrating one embodiment of a power supply circuit in FIG. 1.

FIG. 2 illustrates a circuit configuration as one embodiment of the power supply circuit in FIG. 1. This embodiment uses a P-channel MOSFET QP as the power supply circuit. The gate of the MOSFET QP is constantly given the ground potential of the circuit, whereby it works as a resistive element, and the power supply voltage VCC is transmitted to an internal power supply by column, namely, to the memory cell power supply line. Here, in the write operation to a memory cell, the potential of one of the complimentary bit lines /BL and BL varies from a pre-charge level such as the power supply voltage VCC to a low level such as the ground potential of the circuit; then the potential of the memory cell supply line temporally drops due to the capacitance coupling with the bit line that has had such a potential variation. The ON-resistance of the MOSFET QP is set to have such a comparably large resistance as the temporary potential drop of the memory cell supply line is allowed. Thus, the operational voltage to the memory cell is lowered in the write operation, whereby the SNM is lowered to enhance the write margin. On the other hand, both the potentials of the non-selected bit lines /BL and BL are maintained to a high level such as the power supply voltage VCC; accordingly, the corresponding memory cell supply lines are also maintained to the power supply voltage VCC. Therefore, in the memory cells of which word lines are put in the selected state, the power supply voltage is maintained high, so that the SNM can be maintained high.

Figure 3:
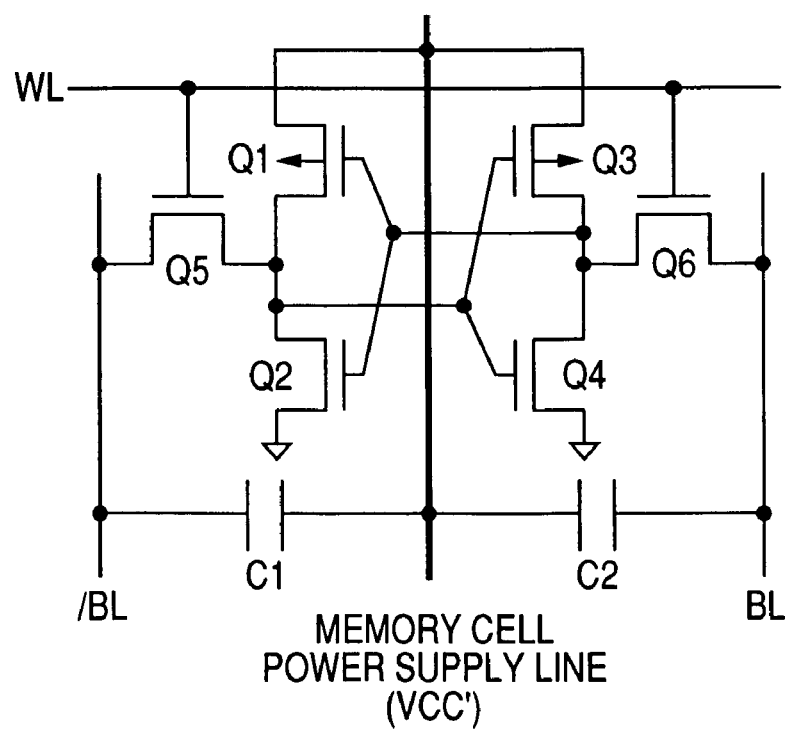
FIG. 3 is a circuit diagram of a memory cell in one embodiment relating to this invention.

FIG. 3 illustrates a circuit configuration of the memory cell as one embodiment relating to this invention. The memory cell includes two CMOS inverters composed of a P-channel MOSFET Q1 and an N-channel MOSFET Q2, and a P-channel MOSFET Q3 and an N-channel MOSFET Q4, wherein inputs and outputs thereof are cross-connected to form a latch circuit, and an address selection switch composed of N-channel MOSFET Q5 and Q6 that are provided between a pair of input/output nodes N1, N2 of the latch circuit and the corresponding bit lines /BL, BL. The gates of the MOSFET Q5, Q6 for address selection are connected to the corresponding word line WL.

In the memory cell in this embodiment, the operational voltage VCC' to the memory cell corresponding to the complimentary bit lines /BL and BL is supplied from the memory cell supply line provided between the same complimentary bit lines /BL and BL, which is extended in parallel to the bit lines. Concretely, the memory cell supply line is connected to the sources of the P-channel MOSFETs Q1 and Q3 constituting the CMOS inverter. The memory cell supply line as such possesses a parasitic capacitance C1 between itself and the one complimentary bit line /BL, and possesses a parasitic capacitance C2 between itself and the other complimentary bit line BL.

Figure 4A:
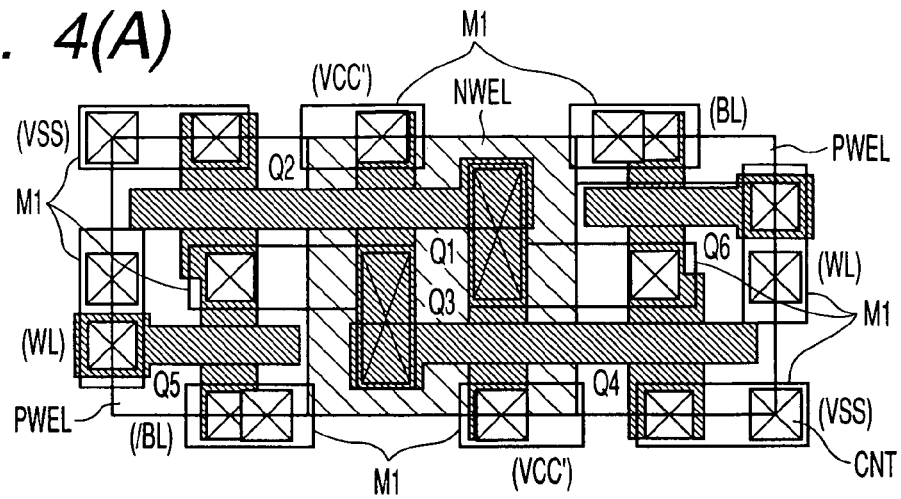
FIG. 4 including FIG. 4(A), FIG. 4(B)
FIG. 4(C) is a layout chart illustrating one embodiment of a memory cell relating to this invention.
Figure 4B:
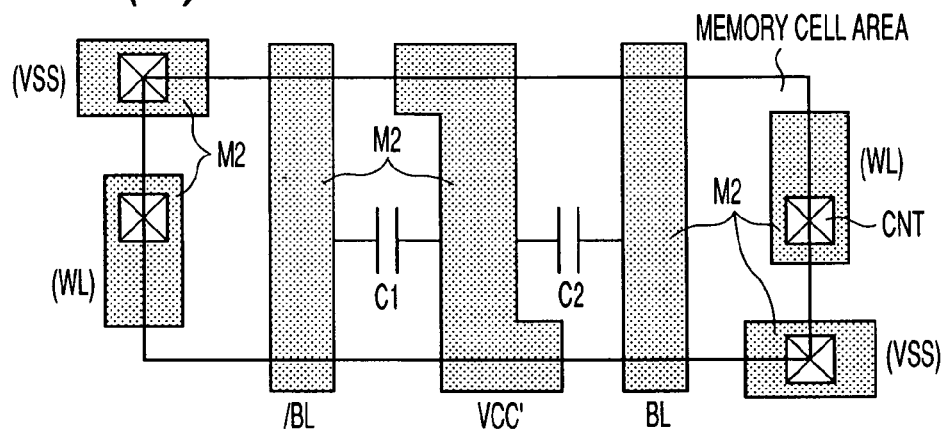
Figure 4C:
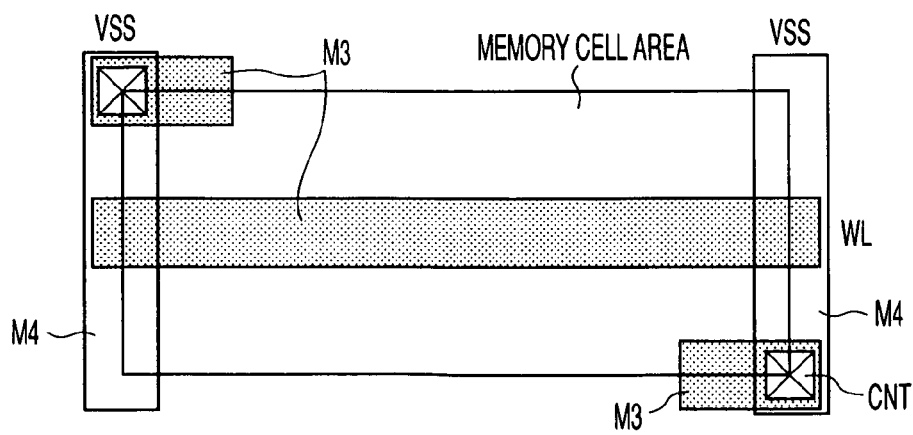

FIG. 4 illustrates a layout of the memory cell as one embodiment relating to this invention. FIG. 4(A) illustrates the layout patterns of the sources, drains, and gates of the MOSFETs, and the contact wirings and contact holes; FIG. 4(B) illustrates the layout patterns of the memory cell supply line that supplies the operational voltage VCC' to the bit lines /BL, BL and the memory cell, and the contact wirings and contact holes; and FIG. 4(C) illustrates the layout patterns of the ground line that supplies the ground potential VSS to the word line WL and the memory cell. The contact holes are illustrated by a square mark CNT with a mark x applied.

In FIG. 4(A), the P-channel MOSFETs Q1 and Q3 are formed in N-WELLs provided in the center with slash lines applied. On the other hand, the N-channel MOSFETs Q2, Q4 and Q5, Q6 are formed in the P-substrate or P-WELLs except the above N-WELLs. With regard to the MOSFETs Q1, Q2, Q3, Q4 that constitute the CMOS inverter, the gate electrodes thereof are formed integrally. The contact wirings and contact holes each have the indications of connection destination such as WL, /BL, VCC', BL, WL, and VSS. The MOSFETs Q1, Q2, and Q5 and the MOSFETs Q3, Q4, and Q6 are placed symmetrically as the former coincides with the latter by the rotation of 180° at the center of the memory cell. The wiring layer of the contact wirings is indicated by the voided pattern surrounding the contact holes, and is formed on a metal layer M1 being the first layer, which is not especially specified.

In FIG. 4(B), the bit lines /BL and BL correspond to the sources and drains of the MOSFETs Q5 and Q6; they are disposed to be vertically extended in the drawing at parts of ¼ and ¾ among boundaries equally dividing a region of the memory cell into four in a horizontal direction in the drawing, and are formed on a metal layer M2 being the second layer, which is not especially specified. The memory cell supply line (VCC') is formed on the metal layer M2 being the second layer in the same manner as the bit lines /BL, BL, and is disposed so as to vertically extend at a part of a center (2/4) among the boundaries approximately equally dividing the region of the memory cell into four. The memory cell supply line (VCC') has a projection that extends toward the adjoining bit line /BL on the upper part thereof, which serves to connect the memory cell supply line (VCC') to the source of the P-channel MOSFET Q1; and it also has a projection that extends toward the adjoining bit line BL on the lower part thereof, which serves to connect it to the source of the P-channel MOSFET Q3. This wiring layout will form the parasitic capacitance C1 between the bit line /BL and the memory cell supply line (VCC') and the parasitic capacitance C2 between the bit line BL and the memory cell supply line (VCC').

In FIG. 4(C), the word line WL extends horizontally on the center region of the memory cell, which is formed on a metal layer M3 being the third layer. The ground line VSS extends vertically in the memory cell area, which is formed on a metal layer M4 being the fourth layer. This ground line VSS is used together with the adjoining ground line VSS. Making up the memory cell as this embodiment makes it easy to form the power supply lines by column. This makes it possible to form the coupling capacitances C1, C2 between the bit lines /BL, BL and the memory cell supply line (VCC').

Figure 5:
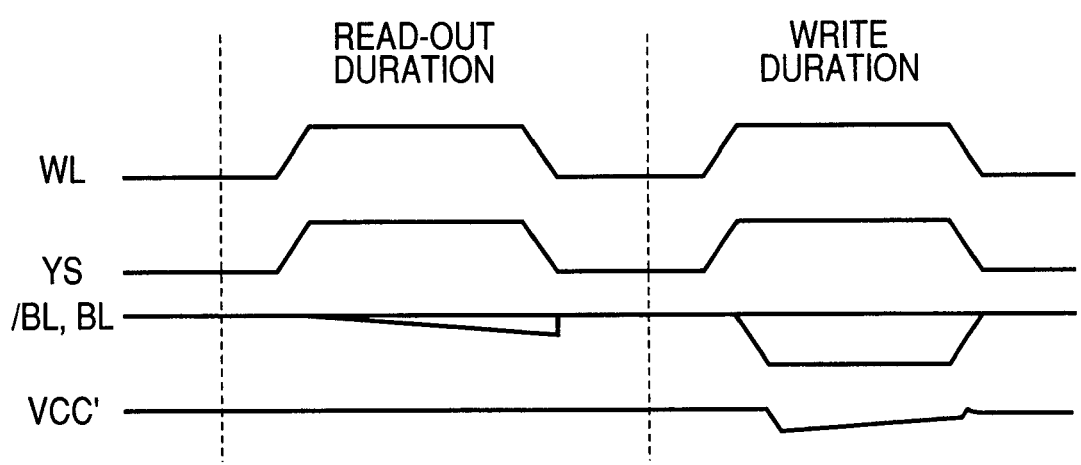
FIG. 5 is a waveform chart illustrating an example of the operation of the SRAM relating to this invention.

FIG. 5 illustrates a waveform in the operation of the SRAM relating to this invention. In the read-out operation of the SRAM, the MOSFETs Q5 and Q6 for address selection of the memory cell are made ON by the selection operation of the word line WL, and one of the bit lines /BL and BL is lowered in correspondence with one of the memory nodes N1 and N2 that is put into Low level. Here, the bit lines /Bl and BL have comparably large capacitances because of multiple memory cells connected thereto, and the MOSFETTs Q5 and Q6 for address selection have comparably large on-resistances; accordingly, the lowering level of the bit lines /BL and BL in the read-out signal is slight and the lowering slope thereof is gentle. Therefore, the voltage VCC' of the memory cell supply line does not substantially vary to maintain the power supply voltage VCC, although there exist the parasitic capacitances (coupling capacitances) C1 and C2 between the bit lines /BL, BL and the memory cell supply line. This will maintain the static noise margin (SNM) in the read-out operation at a high level. The slight level difference of the bit lines /BL and BL in the read-out signal is amplified by the sense amplifier, which is outputted as the data output.

In the write operation of the SRAM, the MOSFETs Q5 and Q6 for address selection of the memory cell are made ON by the selection operation of the word line. One of the bit lines /BL and BL is lowered sharply to the ground potential of the circuit in correspondence with the write signal from the write driver. Such sharp lowering with full swing in the write signal is transmitted to the memory cell supply line through the parasitic capacitances (coupling capacitances) C1 and C2, and temporarily lowers the operational voltage VCC' to the memory cell. Thus, the operational voltage VCC' lowers owing to the coupling capacitances. However, the operational voltage VCC' recovers gradually toward the power supply voltage VCC, since it is supplied with the power supply voltage VCC through the resistive element of the power supply circuit. In this duration, one of the bit lines /BL and BL is put into Low level, and the memory node N1 or N2 is pulled down to Low level from High level through the MOSFET Q5 or Q6 that is made ON according to the selected state of the word line, whereby the stored information of the storage unit in the memory cell is inversed.

For example, when the memory node N1 is pulled down to Low level from High level, the MOSFET Q1 that maintains High level of the memory node N1 lowers the memory node N1 also by the lowering of the memory cell supply voltage VCC'. At the same time, High level of the bit line BL is transmitted to the gate (memory node N2) of the MOSFET Q2 through the MOSFET Q6, which makes the MOSFET Q2 ON. In this manner, the three factors overlapped sharply pulls down the memory node N1, which makes the P-channel MOSFET Q3 ON, thus forming a path that brings the memory node N2 into High level. As the result, the memory node N1 sharply varies from High level to Low level and the memory node N2 sharply varies from Low level to High level, which enhances the write margin. Thus, this embodiment will enhance the write margin, if the power supply voltage VCC lowers owing to the micro-structuring of devices and so forth to lower the drivability of the write driver.

Here, if the word line WL is selected, the write operation will not be performed. That is, there does not occur such a voltage drop as the above even by the coupling with the writing bit line, in the memory cells connected to the non-selected complimentary bit lines /BL and BL for retaining the stored data; therefore, it is possible to maintain the power supply voltage VCC in the same manner as the read-out operation. In regard to the memory cells wherein the word line is selected and the MOSFETs Q5,Q6 are made ON, the one to retain the stored data can maintain a large static noise margin (SNM). In this manner, the voltage variation in the non-selected column during the write operation and the voltage variation in the selected bit lines during the read-out operation are comparably gentle with limited amplitude because of the slight amplitude of the bit lines in the memory cell; and the effect of the coupling is limited and the lowering of the SNM is limited to attain a stable operation.

Figure 6:
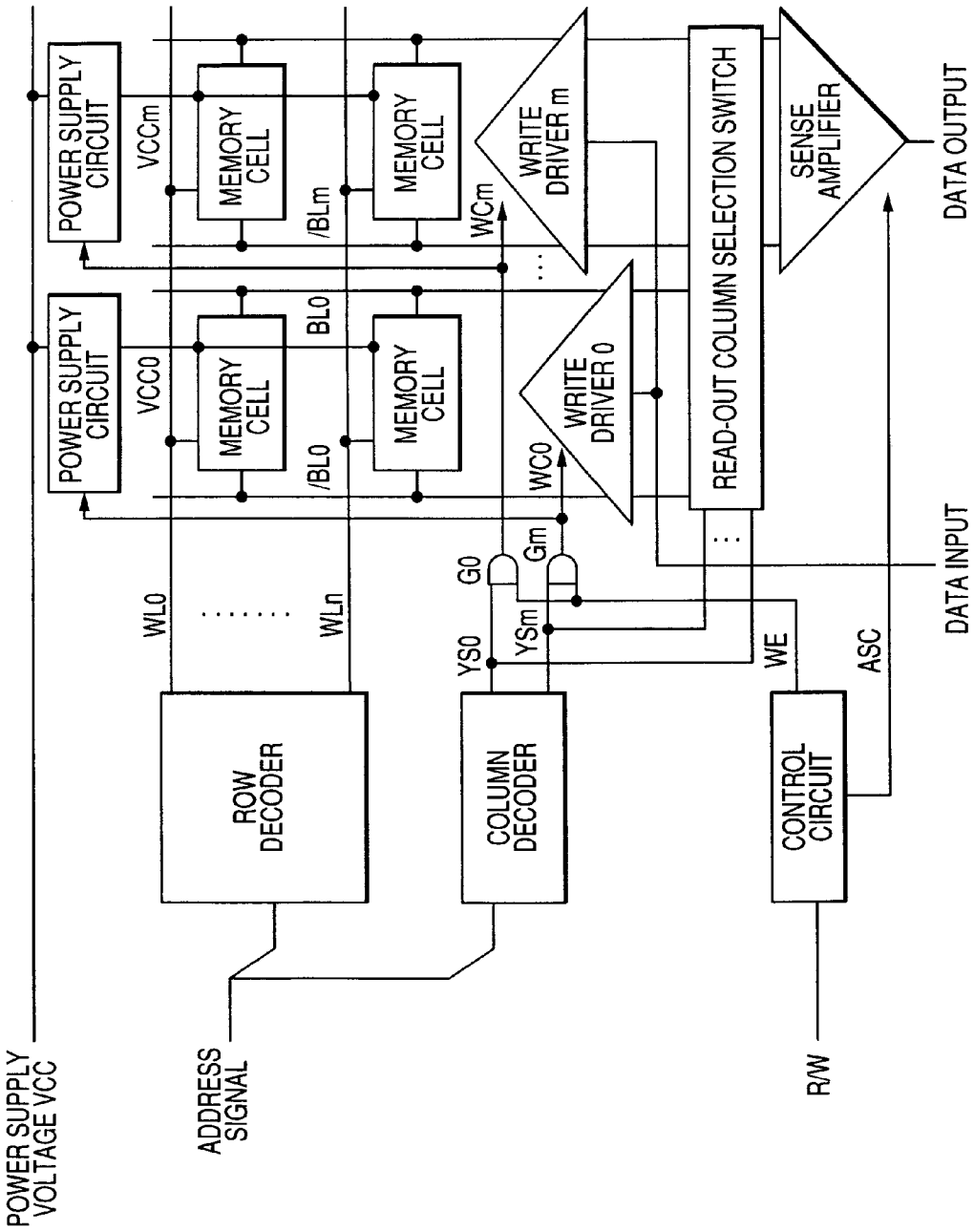
FIG. 6 is a block diagram illustrating another embodiment of the SRAM relating to this invention.

FIG. 6 illustrates a circuit configuration of the SRAM as another embodiment relating to this invention. In this embodiment, the same write signal WE as that in FIG. 1 is combined with the bit line selection signals YS0 to YSm formed by the column decoder and gate circuits G0 to Gm and so forth, which is used for forming activation signals WC0 to WCm to the write drivers that are provided to the bit lines each. Thus, as the write operation is instructed, the write driver corresponding to the column address is activated, and the data input is written into the memory cell connected to the word line selected by the word driver. On the other hand, as the read-out operation is instructed, the read-out column selection switch becomes ON in correspondence with the column address, and the signals on the selected bit lines /BL and BL are transmitted to the input of the sense amplifier, which are amplified based on the sense amplifier control signal SAC to be outputted as the data output.

This embodiment provides the write drivers corresponding to the complimentary bit lines /BL0 and BL0 to /BLm and BLm. In such a construction, the write signal corresponding to the data input can be transmitted directly to the complimentary bit lines /BL and BL without intervention of the column selection switch as the above embodiment in FIG. 1, so that one of the bit lines-pair can be pulled down sharply from the pre-charge level to Low level. In this embodiment, the activation signals WC0 to WCm are used as the control signals for the power supply circuits 0 to m that are connected to the memory cell supply lines VCC0 to VCCm corresponding to the bit lines /BL0 and BL0 to /BLm and BLm each. The other construction is the same as the embodiment in FIG. 1.

Figure 7:
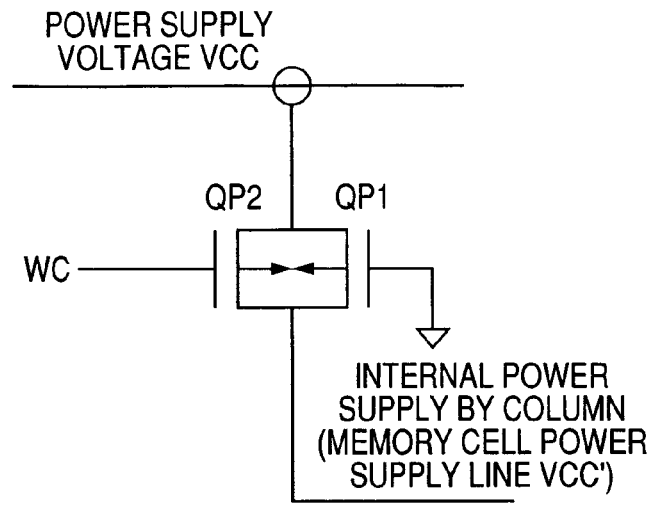
FIG. 7 is a circuit diagram illustrating one embodiment of a power supply circuit used for the SRAM in FIG. 6.

FIG. 7 illustrates a circuit configuration of the power supply circuit used for the SRAM in FIG. 6 as one embodiment. In this embodiment, the power supply circuit is provided with the P-channel MOSFET QP1 in the same manner as the power supply circuit in FIG. 2 and a P-channel MOSFET QP2 with the activation signal WC connected to the gate thereof, wherein the two P-channel MOSFETs are connected in parallel. The signal WC is put into High level in correspondence with the selected complimentary bit lines /BL and BL. Accordingly, the P-channel MOSFET QP2 of the power supply circuit is made OFF in correspondence with the selected complementary bit lines /BL0 and BL0 as an example. Thereby, in the write operation, the operational supply voltage VCC' to the selected memory cell is lowered owing to the coupling with the bit lines to which the write signal is transmitted. On the other hand, in the power supply circuits corresponding to the other non-selected complimentary bit lines including the non-selected complimentary bit lines /BLm and BLm, both the P-channel MOSFETs QP1 and QP2 are made ON, and the supply voltage VCC' to the non-selected memory cells are maintained to be virtually equal to the power supply voltage VCC.

In this embodiment, if the on-resistance of the P-channel MOSFET QP1 is set sufficiently high, the coupling capacitances C1, C2 will not necessarily be needed. The P-channel MOSFET QP2 of the power supply circuit is made OFF in correspondence with the selected complementary bit lines /BL0 and BL0 as an example, and in consequence only a minute current is supplied from the P-channel MOSFET QP1 having a high resistance. Therefore, through the P-channel MOSFET QP1 as such flow the leakage current in the multiple memory cells connected to the complementary bit lines /BL0 and BL0 and the current in the memory cells wherein the inverse writing is performed, which corresponds to the output signal variation of the CMOS inverter. Therefore, without the above capacitance coupling, the operational voltage VCC' to the memory cell lowers. The lowering of this operational voltage VCC' will increase the write margin to the memory cell.

In contrast to this, even if the word line is selected, the write operation will not be performed. In regard to the memory cells connected to the non-selected complimentary bit lines, which have to retain the stored data, the memory cell supply lines are connected to the power supply voltage VCC with low impedance by the ON-state of the MOSFETs QP1 and QP2, so that the memory cell supply lines can be maintained to the power supply voltage VCC more stably. Thereby, the memory cells to retain the stored data among those wherein the word line is selected and the above MOSFETs Q5, Q6 are made ON can maintain a large static noise margin (SNM). Therefore, the layout of the memory cell in this embodiment is not limited to the one in FIG. 4. For example, the bit lines /BL, BL and the memory cell supply lines VCC' may be made on separate wiring layers, thereby expanding the freedom of degree in designing the circuit layout.

Figure 8:
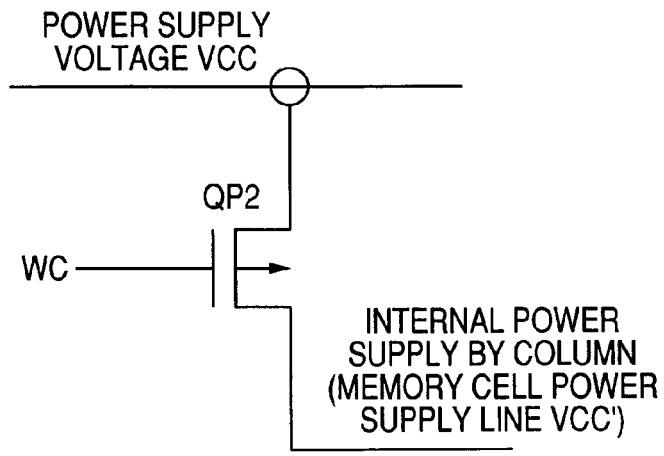
FIG. 8 is a circuit diagram illustrating another embodiment of the power supply circuit used for the SRAM in FIG. 6.

FIG. 8 illustrates a circuit configuration of the power supply circuit used for the SRAM in FIG. 6 as another embodiment. In this embodiment, the power supply circuit omits the P-channel MOSFET QP1 in FIG. 7 and includes only the P-channel MOSFET QP2 having the activation signal WC supplied to the gate thereof. In this configuration, the P-channel MOSFET QP2 of the power supply circuit is made OFF in correspondence with the selected complementary bit lines /BL0 and BL0 as an example, and in consequence, the power supply for all the memory cells that correspond to the selected complementary bit lines /BL0 and BL0 is cutoff. Therefore, through the P-channel MOSFET QP1 as such flow the leakage current in the multiple memory cells connected to the complementary bit lines /BL0 and BL0 and the current in the memory cells wherein the inverse writing is performed, which corresponds to the output signal variation of the CMOS inverter. Therefore, without the above capacitance coupling, the operational voltage VCC' to the memory cell lowers significantly.

Therefore, even if there is a possibility that the operational voltage VCC' temporarily drops lower than the lower limit for the memory cell, High level and Low level from the write driver are written through the MOSFETs Q5 and Q6 into the capacitances at the memory nodes N1 and N2 of the selected memory cell having the word line selected. On the other hand, in the memory cells having the word line non-selected, the MOSFETs Q5 and Q6 are made OFF; therefore, even if the operational voltage VCC' is brought into a lower level than the lower limit, the capacitances at the memory nodes N1 and N2 retain charges to be stored. Therefore, even if the P-channel MOSFET QP2 is made OFF for a short duration required for the write operation to the memory cell, the non-selected memory cells retain the stored data by the charges to be stored in the same manner as the dynamic memory cells. Thereafter, the P-channel MOSFET QP2 is made ON to supply the power supply voltage VCC, thereby to recover the temporarily decreased charges to be stored.

In this embodiment, in the state that the power supply for all the memory cells corresponding to the selected complementary bit lines /BL0 and BL0 as above is temporarily cut off by the OFF-state of the MOSFET QP2, the static memory cells perform the same storage operation as two dynamic memory cells that have mutually different charged states. Even when part of the charges to be stored at the memory node N1 or N2 are temporarily disappeared, the inverter is activated by the power supply that is given by the ON-state of the MOSFET QP2 accompanied with the write completion, thereby recovering the original state. This embodiment needs to set the pulse width of the write signal WE in such a manner that the internal power supply VCC' to the selected column in the write operation does not reach the level of erasing the data in the non-selected memory cells. This embodiment, using a simply configured power supply circuit, enhances the write margin of the memory cell corresponding to the selected complimentary bit lines, and also secures the SNM of the non-selected memory cells connected to the non-selected bit lines.

Figure 9:
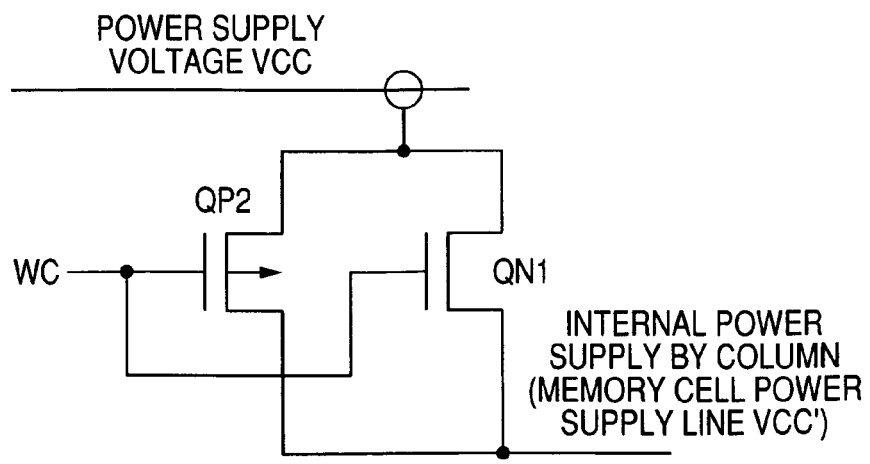
FIG. 9 is a circuit diagram illustrating another embodiment of the power supply circuit used for the SRAM in FIG. 6.

FIG. 9 illustrates a circuit configuration of the power supply circuit used for the SRAM in FIG. 6 as another embodiment. This embodiment includes an N-channel MOSFET QN1 connected in parallel to the P-channel MOSFET QP2 in FIG. 7. The gates of the N-channel MOSFET QN1 and the P-channel MOSFET QP2 are mutually connected, where the activation signal WC is supplied. In this embodiment, as the P-channel MOSFET QP2 of the power supply circuit is made OFF in correspondence with the selected complementary bit lines /BL0 and BL0 as an example, the N-channel MOSFET QN1 is made ON instead. Therefore, when the leakage current in the multiple memory cells connected to the complementary bit lines /BL0 and BL0 and the current corresponding to the output signal variation of the CMOS inverter and flowing in the memory cells in which the inverse writing is performed flow, the operational voltage VCC' to the memory cell will not be lowered to VCC-Vth. Here, Vth represents the threshold voltage of the N-channel MOSFET QN1. Thus, as compared to the embodiment in FIG. 8, when the pulse width of the write signal WE is set comparably large, there will not be such an apprehension that the data in the non-selected memory cells are erased.

Figure 10:
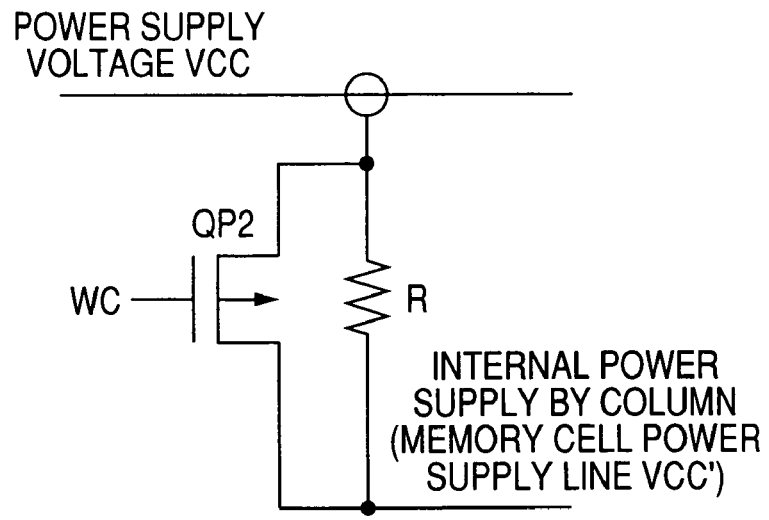
FIG. 10 is a circuit diagram illustrating another embodiment of the power supply circuit used for the SRAM in FIG. 6.

FIG. 10 illustrates a circuit configuration of the power supply circuit used for the SRAM in FIG. 6 as another embodiment. This embodiment takes on the same configuration as that in FIG. 7, wherein the P-channel MOSFET QP1 is replaced by a resistive element R. This resistive element R can be replaced by a resistive unit except the MOSFET, such as a diffusion resistor, a poly-silicon resistor, or the like. The operation is the same as that in FIG. 7.

Figure 11:
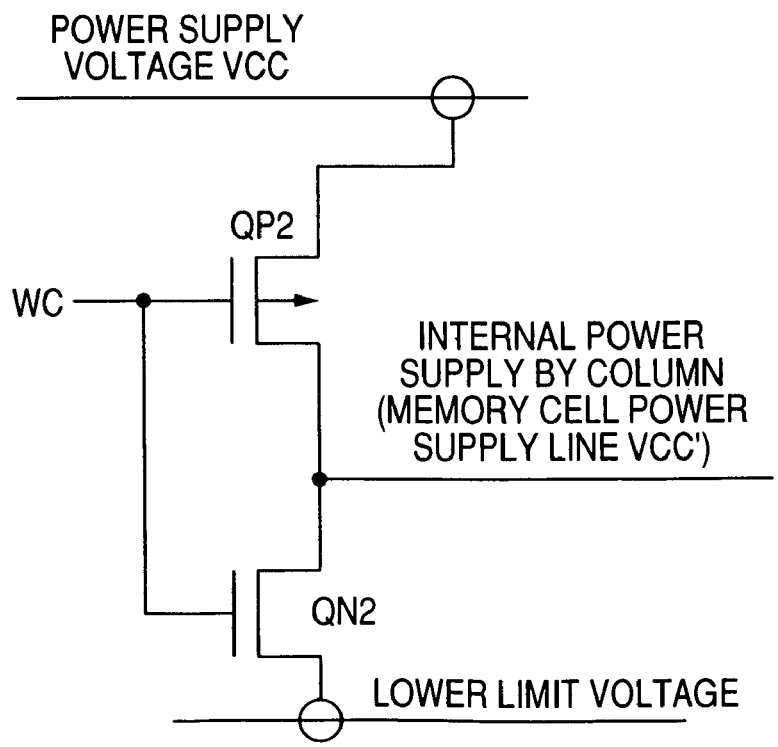
FIG. 11 is a circuit diagram illustrating another embodiment of the power supply circuit used for the SRAM in FIG. 6.

FIG. 11 illustrates a circuit configuration of the power supply circuit used for the SRAM in FIG. 6 as another embodiment. This embodiment is a modified example from the embodiment in FIG. 9. The lower limit voltage is transmitted to the internal power supply by column (memory cell supply line VCC') by an N-channel MOSFET QN2. In the embodiment in FIG. 9, the power supply circuit supplies the voltage VCC-Vth to the selected column in the write operation, wherein Vth is the threshold voltage of the N-channel MOSFET. This embodiment supplies the lower limit voltage to the memory cell by the N-channel MOSFET QN2. Therefore, the lower limit voltage is lower than the voltage VCC-Vth. If the lower limit voltage is intended to be higher than the voltage VCC-Vth, it is only needed to use a P-channel MOSFET, inverse the activation signal WC by an inverter, and supply the inverted activation signal WC to the gate of the P-channel MOSFET that supplies the lower limit voltage. This case needs to provide a lower limit voltage generator separately.

Figure 12:
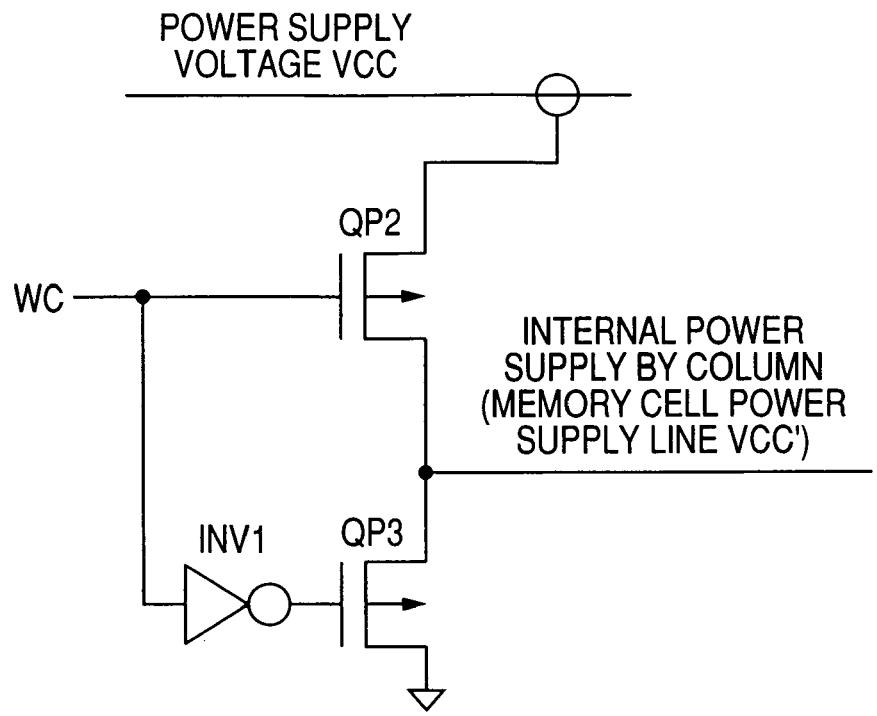
FIG. 12 is a circuit diagram illustrating another embodiment of the power supply circuit used for the SRAM in FIG. 6.

FIG. 12 illustrates a circuit configuration of the power supply circuit used for the SRAM in FIG. 6 as another embodiment. This embodiment is a modified example from the embodiment in FIG. 11, which uses the threshold voltage Vth of a P-channel MOSFET QP3 as the lower limit voltage. This embodiment includes the P-channel MOSFET QP3 between the memory cell supply line VCC' and the ground potential VSS. The activation signal WC is supplied to the gate of this P-channel MOSFET QP3 through an inverter INV1. This power supply circuit brings the activation signal WC into High level in correspondence with the selected bit lines /BL, BL. Thereby, the P-channel MOSFET QP2 is made OFF and the P-channel MOSFET QP3 is made ON in turn. The ON-state of the P-channel MOSFET QP3 lowers the memory cell operational voltage VCC' down to Vth. Thus, the memory cell connected to the selected bit lines /BL, BL is to operate with the threshold voltage Vth of the P-channel MOSFET QP3 served as the operational voltage.

The leakage current in the multiple word-line non-selected memory cells connected to the selected complimentary bit lines /BL, BL and the data inversing current in the word-line selected memory cell are consumed, as already mentioned. However, the power supply circuit in this embodiment does not have the current paths corresponding to the above currents; and the current consumption is substantially the same as the embodiment in FIG. 8. However, this embodiment does not wait for the lowering of the memory cell operational voltage as the embodiment in FIG. 8. The power supply circuit in this embodiment brings the MOSFET QP3 into ON in the write operation, positively lowers the memory cell operational voltage VCC' to Vth to complete the writing for a short duration in a state of increased write margin, and immediately makes the P-channel MOSFET QP2 ON. This configuration is immune to the dispersion of elements and so forth, and facilitates the setting of write time.

Figure 13:
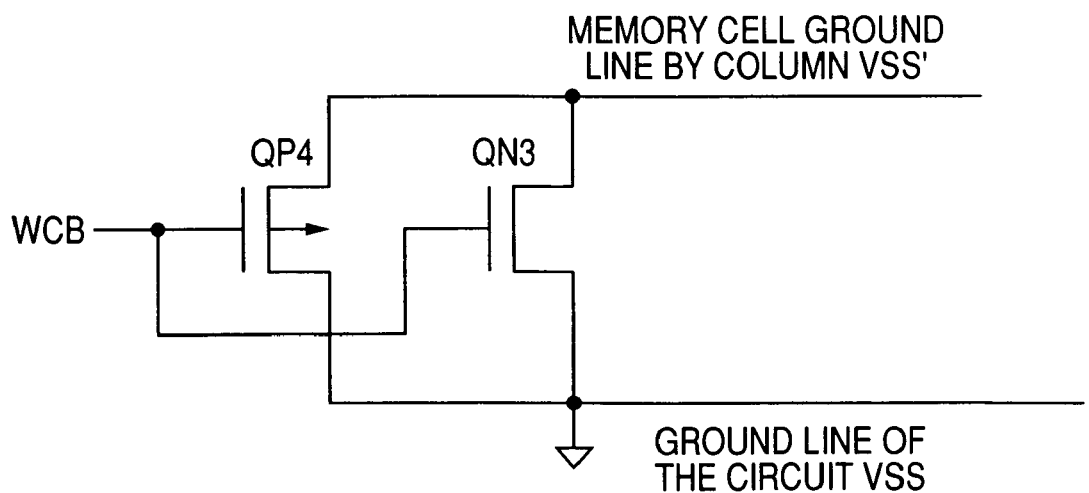
FIG. 13 is a circuit diagram illustrating another embodiment of the power supply circuit used for the SRAM in FIG. 6.

FIG. 13 illustrates a circuit configuration of the power supply circuit used for the SRAM in FIG. 6 as another embodiment. This embodiment provides the memory cell ground lines VSS0 to VSSm corresponding to the complimentary bit lines /BL0, BL0 to /BLm, BLm each. The memory cell ground line VSS' in FIG. 13 is the ground line to the memory cell connected to the corresponding bit lines /BL0, BL0. This embodiment provides a ground supply circuit as shown in FIG. 13 between the memory cell ground line VSS' by column and the ground line VSS of the circuit. This embodiment does not have the power supply circuit located on the side of the power supply voltage VCC, as seen in FIG. 1 and FIG. 6; and it also enhances the write margin of the memory cell corresponding to the selected complimentary bit lines and secures the SNM of the non-selected memory cells connected to the non-selected complimentary bit lines.

In this embodiment, an activation signal WCB is put into Low level in correspondence with the selected complimentary bit lines /BL, BL. Thereby, an N-channel MOSFET QN3 is made OFF, and a P-channel MOSFET QP4 is made ON. Accordingly, the leakage current flowing through the multiple memory cells connected to the selected complimentary bit lines /BL, BL and the current for the writing operation will flow through the P-channel MOSFET QP4, which raises the memory cell ground potential VSS' by Vth. Thus, the memory cell is given such a low voltage as VCC-Vth for the write operation, and the power supply circuit in this embodiment is equivalent to that in FIG. 9, which also increases the write margin. On the other hand, with regard to the memory cell ground line VSS' corresponding to the non-selected complimentary bit lines /BL, BL, the N-channel MOSFET QN3 is ON, and the ground potential VSS is transmitted as it is.

Thereby, the operational voltage to the non-selected memory cells connected to the non-selected complimentary bit lines is VCC, and the SNM can be secured in the same manner as the above.

The ground supply circuit in this embodiment includes the P-channel MOSFET QP4 and N-channel MOSFET QN3 in a parallel configuration. In the same manner as shown in FIG. 12, the activation signal WCB inverted by the inverter INV1 is supplied to the gates of the P-channel MOSFET QP4 and N-channel MOSFET QN3. The ground supply circuit can be regarded as substantially the same as the above power supply circuit. Since the memory cell operates when the potential difference between the power supply voltage VCC and the ground voltage VSS is given as the operational voltage, to supply the voltage VCC' obtained by lowering the power supply voltage VCC as the above embodiment and to supply the voltage VSS' obtained by raising the ground voltage VSS of the circuit is the same in terms of the operation of the memory cell.

In order to raise the ground line to the high level by the capacitance coupling between the bit lines and itself as seen in the embodiment in FIG. 1, it is only needed to pre-charge the bit lines to Low level and discharge one of the bit lines to High level such as the power supply voltage VCC in correspondence with the input data.

Figure 14A:
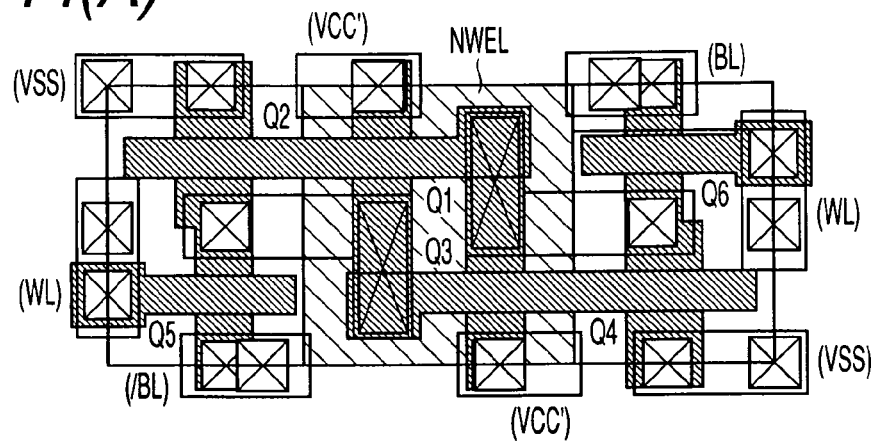
FIG. 14 including FIG. 14(A), FIG. 14(B)
FIG. 14(C) is a layout chart illustrating another embodiment of a memory cell relating to this invention.
Figure 14B:
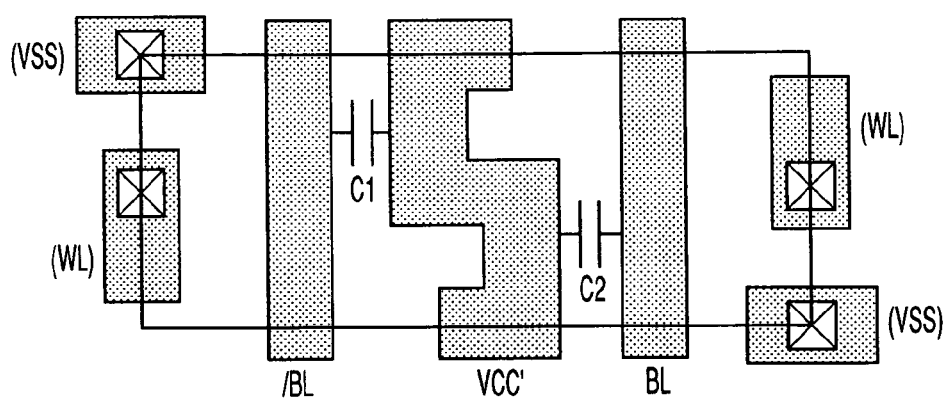
Figure 14C:
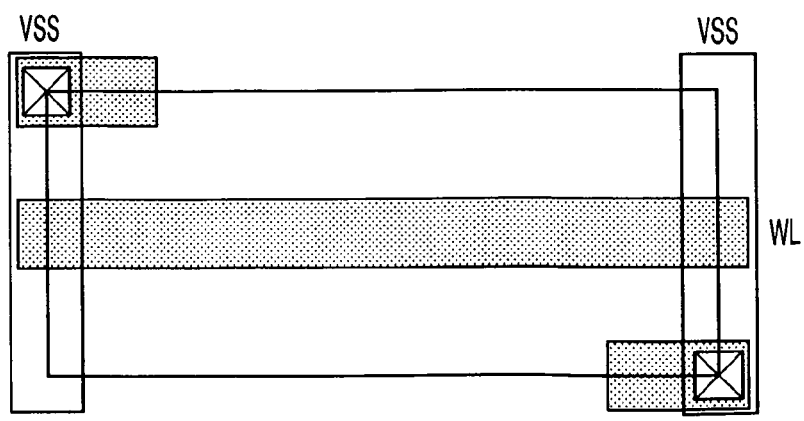

FIG. 14 illustrates a layout of the memory cell as another embodiment relating to this invention. FIG. 14(A) and FIG. 14(C) are virtually the same as FIG. 4(A) and FIG. 4(C), wherein the marks indicating the wiring layers M1 through M4 are omitted. This embodiment exhibits a device for increasing the capacitances of the parasitic capacitors C1 and C2. The parasitic capacitances can be increased also by widening the wiring width of the power supply line VCC' and by narrowing the gap between the bit line /BL and BL. On the other hand however, the parasitic capacitance between the power supply line VCC' and other circuit nodes such as the ground potential of the circuit becomes increased. Since this parasitic capacitance functions toward impeding the potential variation by the coupling with the bit lines, the above method cannot be evaluated as an effective measure to reinforce the coupling capacitance. Now, this embodiment makes the patterns meander so as to equally narrow the gap between the bit line /BL and BL without widening the wiring width of the power supply line VCC'. This method makes it possible to increase the parasitic capacitances C1 and C2, yet to maintain the parasitic capacitance between the power supply line VCC and the ground potential of the circuit as it is. Therefore, this embodiment achieves an effective lowering of the voltage VCC' to the memory cells in correspondence with the potential variations of the bit lines by the write operation.

Figure 15:
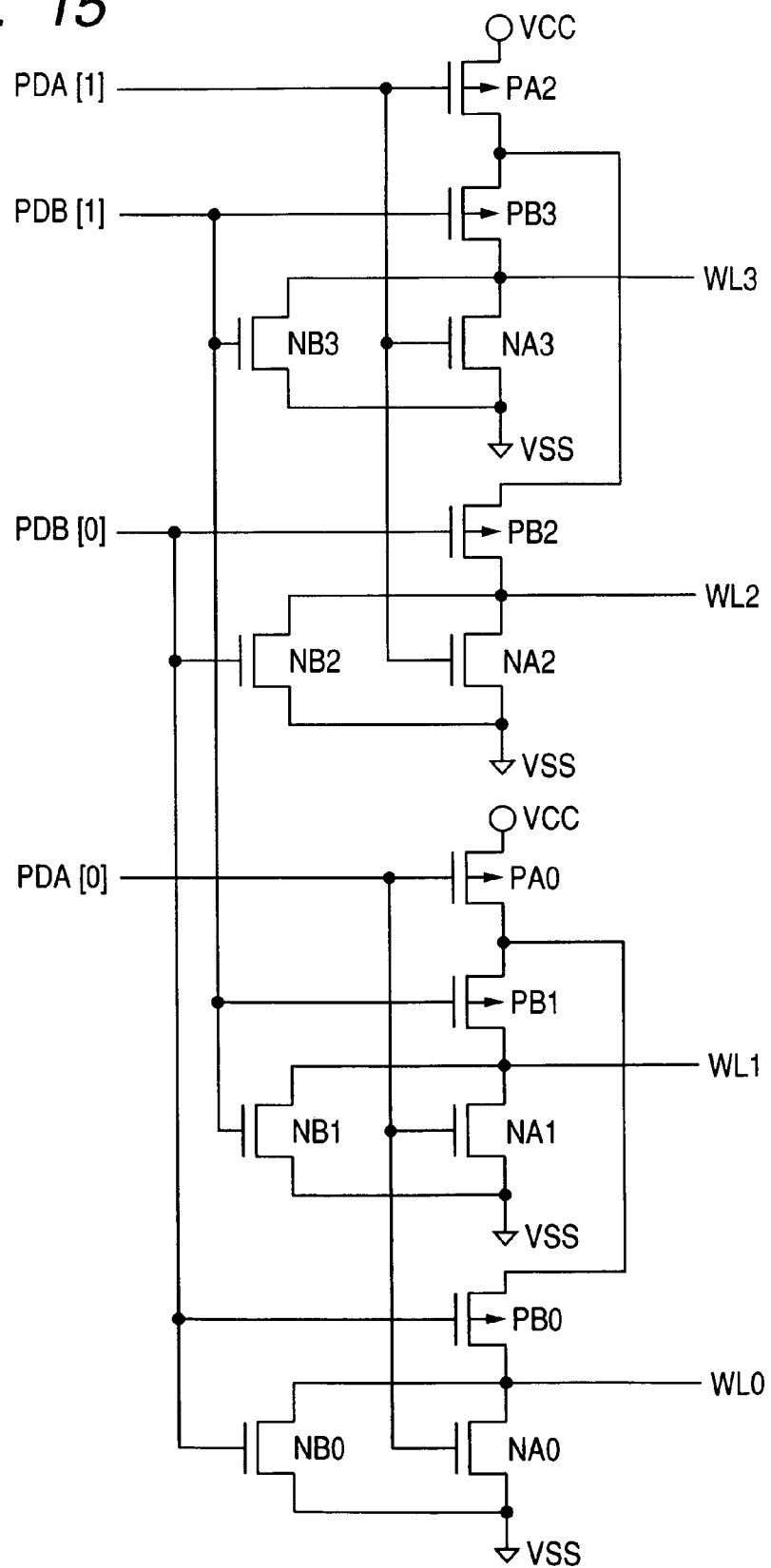
FIG. 15 is a circuit diagram illustrating one embodiment of a word driver used for the SRAM in FIG. 1 or FIG. 6.

FIG. 15 illustrates a circuit configuration of a word driver used for the SRAM in FIG. 1 or FIG. 6 as one embodiment. This circuit diagram typically illustrates four word drivers corresponding to four word lines WL0 through WL3 as an example. This embodiment uses the NOR gate as the word driver when High level (1) is defined as the positive logic. Taking the word driver corresponding to the word line WL0 as an example, P-channel MOSFETs PA0 and PB0 are connected in series between the power supply voltage VCC and an output terminal (WL0), and N-channel MOSFETs NA0 and NB0 are connected in parallel between the ground potential VSS of the circuit and the output terminal (WL0). The gates of the P-channel MOSFET PA0 and N-channel MOSFET NA0 are mutually connected, where an input signal PDA [0] is supplied; and the gates of the P-channel MOSFET PB0 and N-channel MOSFET NB0 are mutually connected, where an input signal PDB [0] is supplied.

The source of the P-channel MOSFET PA0 is supplied with the power supply voltage VCC, and the drain of the P-channel MOSFET PB0 is connected to the output terminal (WL0). This output terminal is connected to the word line WL0. The sources of the N-channel MOSFETs NA0 and NB0 are supplied with the ground potential VSS of the circuit; and the drains of the N-channel MOSFETs NA0 and NB0 are mutually connected to the output terminal (WL0).

This embodiment uses the P-channel MOSFET PA0 also as the word driver corresponding to the word line WL1, though not especially specified. In the word driver corresponding to the word line WL1, the P-channel MOSFETs PA0 and PB1 are connected in series, and the N-channel MOSFETs NA1 and NB1 are connected in parallel between the ground potential VSS of the circuit and an output terminal (WL1). The gates of the P-channel MOSFET PA0 and an N-channel MOSFET NA1 are mutually connected, where the input signal PDA [0] is supplied; and the gates of the P-channel MOSFET PB1 and an N-channel MOSFET NB1 are mutually connected, where an input signal PDB [1] is supplied.

In regard to the remaining two word lines WL2 and WL3, the corresponding two word drivers share a P-channel MOSFET PA2 of which source is connected to the power supply voltage VCC. That is, in the word driver corresponding to the word line WL2, in the same manner as the above, P-channel MOSFETs PA2 and PB2 are connected in series between the power supply voltage VCC and an output terminal (WL2), and N-channel MOSFETs NA2 and NB2 are connected in parallel between the ground potential VSS of the circuit and the output terminal (WL2). The gates of the P-channel MOSFET PA2 and N-channel MOSFET NA2 are mutually connected, where an input signal PDA [1] is supplied; and the gates of the P-channel MOSFET PB2 and N-channel MOSFET NB2 are mutually connected, where the input signal PDB [0] is supplied.

The P-channel MOSFET PA2 is also shared by the word driver corresponding to the word line WL3. That is, in the word driver corresponding to the word line WL3, the P-channel MOSFET PA2 and a P-channel MOSFET PB3 are connected in series between the power supply voltage VCC and an output terminal (WL3), and N-channel MOSFETs NA3 and NB3 are connected in parallel between the ground potential VSS of the circuit and the output terminal (WL3). The gates of the P-channel MOSFET PA2 and N-channel MOSFET NA3 are mutually connected, where the input signal PDA [1] is supplied; and the gates of the P-channel MOSFET PB3 and N-channel MOSFET NB3 are mutually connected, where the input signal PDB [1] is supplied.

The input signals PDA [0] and PDA [1] are in the complimentary (exclusive) relation during the active operation, and when one is set to High level, the other becomes Low level. In the same manner, the input signals PDB [0] and PDB [1] are in the complimentary (exclusive) relation during the active operation, and when one is set to High level, the other becomes Low level. These input signals PDA and PDB include clock signal and standby signal components as described later, in addition to the address signal, through not especially specified.

The input signal PDA is set to the upper bits of the address signal, and the input signal PDB is set to the lower bits thereof, which is not especially specified. Accordingly, when the input signal PDA [0] is at Low level and the input signal PDA [1] is at High level, and the input signal PDB [0] is at Low level and the input signal PDB [1] is at High level, the P-channel MOSFETs PA0 and PB0 become ON and the N-channel MOSFETs NA0 and NB0 become OFF, in correspondence with Low level of the input signal PDA [0] and Low level of the input signal PDB [0]. Thereby, the word line WL0 is put into the selected state of High level such as the power supply voltage VCC. In the word drivers corresponding to the other word lines WL1 through WL3, High level of the input signal PDA [1] makes any one of the two P-channel MOSFETs OFF, and makes any one of the two N-channel MOSFETs ON; and the word lines WL1 through WL3 are put into the non-selected state of Low level such as the ground potential VSS.

In the standby state, all of the input signals PDA [0], PDA [1] and the input signals PDB [0], PDB [1] are put into High level. Thereby, all of the P-channel MOSFETs are made OFF, and all of the N-channel MOSFETs are made ON. Now, if there is a leakage current flowing through the P-channel MOSFETs, as mentioned above, the potentials at the nodes of the series connected MOSFETs will rise from VSS toward VCC/2, and the source potentials of the P-channel MOSFETs PA1, PA2 on the side of the power supply voltage VCC will rise, leading to the so-called source biasing effect wherein the sources are reverse biased to the substrate, thereby making it possible to reduce the leakage current to a great extent.

When the word line WL0 is in the selected state, both the P-channel MOSFETs PA0 and PB0 or at least any one of PA0 and PB0 of the corresponding word driver become OFF. The word driver can reduce the leakage current by the source biasing effect attained by the longitudinal stacking of the P-channel MOSFETs being the feature of the NOR logic gates. Especially in the standby state, wherein all of the input signals PDA [0], PDA [1] and the input signals PDB [0], PDB [1] become High level, all of the P-channel MOSFETs are made OFF, and the source biasing effect remarkably reduces the leakage current. Although the P-channel MOSFETs PA0, PA2 are supplied to the two word drivers, as this embodiment, the two word lines are not selected at the same time, which enhances the leakage reduction effect while maintaining the drivability. It is possible to increase the number of the shared word drivers by the power of 2 depending on the decoding logic.

The word driver in this embodiment is characterized in that any special control signal for reducing the leakage current is not needed. When the input signal PDA is made to include the clock signal components, namely, when the bit lines are pre-charged, all the word lines are necessarily made non-selected. In the non-selected state of all the word lines during the pre-charge, the leakage current can be reduced by the above source biasing effect. That is, the leakage current can be reduced not only in the standby state but also in the accessing state to the memory.

As already mentioned, the power supply voltage to the LSI (Large Scale Integrated Circuit) is gradually lowered accompanied with the trend for low power consumption and the trend for micro-structuring the MOSFETs inside the LSI. By the 0.13 μm process, for example, the LSI being operational with the power supply voltage 1.2 V is manufactured. When lowering the power supply voltage to an LSI, the general practice lowers the threshold voltage (Vth) of transistors and increases the current flowing through the transistors in order not to deteriorate the circuit performance (operational speed of the circuit). The 0.13 μm process uses the MOSFETs of which Vth is about 0.4 V, for example. In a transistor with a low Vth increases the so-called sub-threshold current, namely, the current flowing across the source-drain in the OFF-state of the transistor. The sub-threshold current continues to flow even when the circuit configured with this transistor is not operational, which makes a current consumption in the state that an LSI is electrified but is not in operation (standby state). The memory circuit needs to retain the data even in the standby state, and the power supply cannot be disconnected even in the standby state. Therefore, the above word driver is able to solve the problem that the sub-threshold current increases accompanied with the lowering of Vth of the transistors constituting the circuit to thereby increase the current consumption in the standby state.

Figure 16:
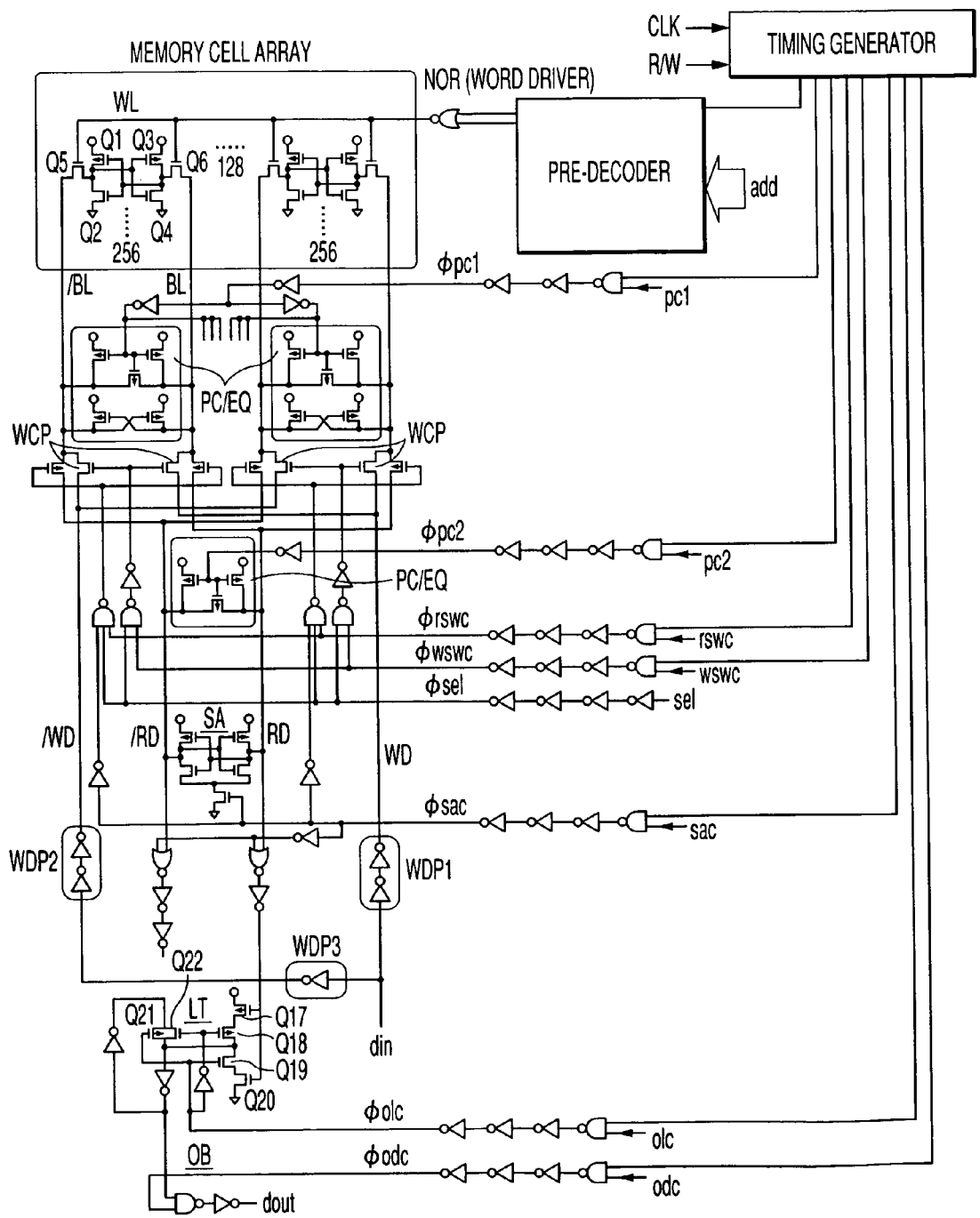
FIG. 16 is a whole circuit diagram illustrating the one embodiment of the SRAM relating to this invention.
Figure 17:
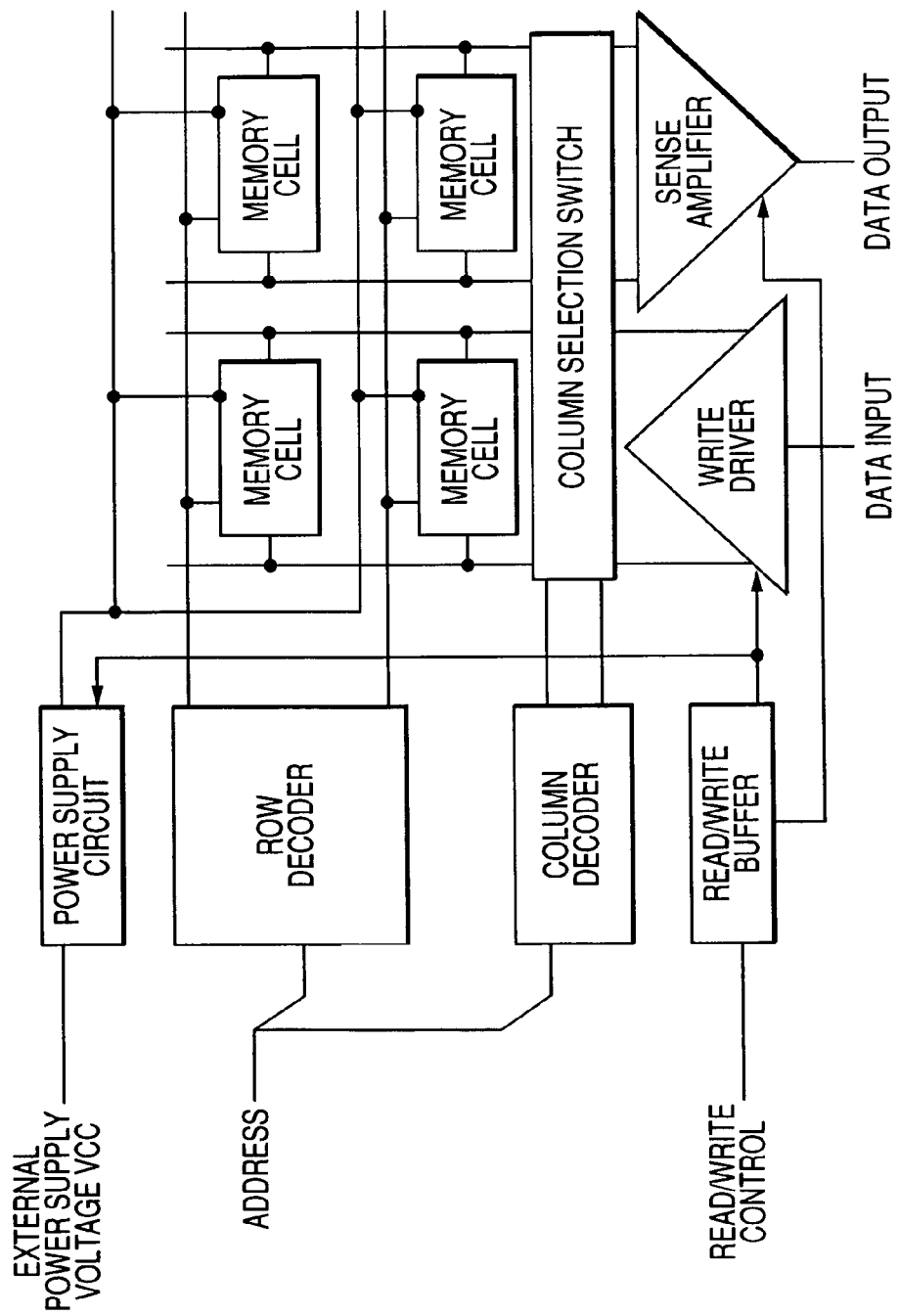
FIG. 17 is a block diagram of an SRAM that the inventors of this application examined in advance on the basis of the patent document 1.
Figure 18:
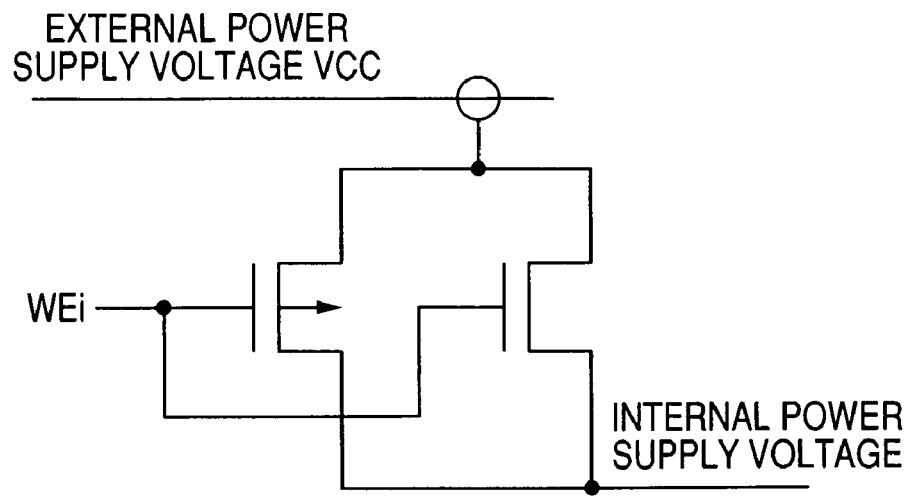
FIG. 18 is a circuit diagram of the voltage supply circuit illustrated in the patent document 1.
Figure 19:
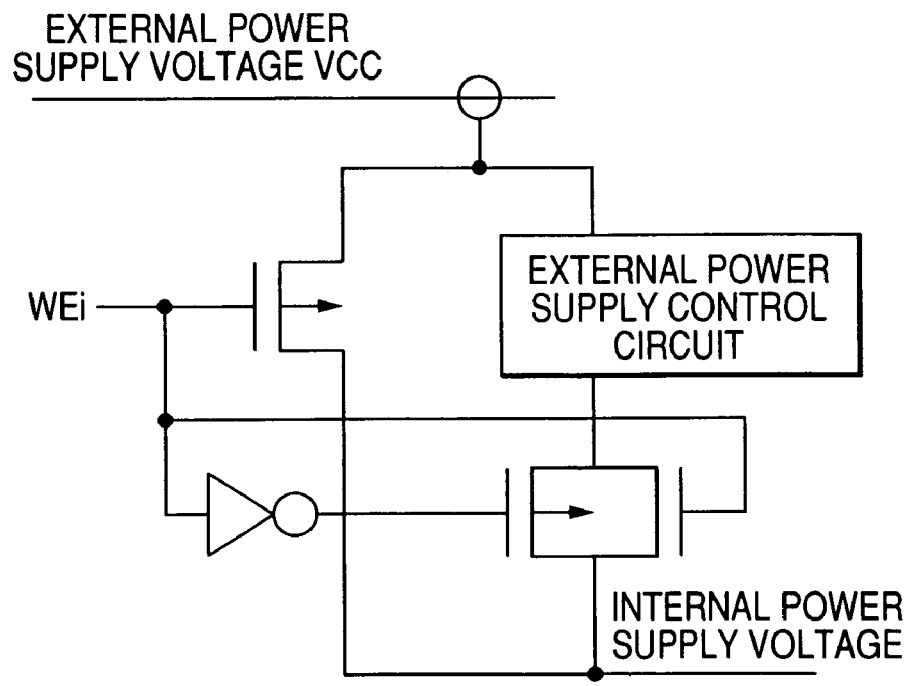
FIG. 19 is another circuit diagram of the voltage supply circuit illustrated in the patent document 1.

FIG. 16 illustrates the whole circuit configuration of the SRAM relating to this invention as one embodiment. The SRAM includes a memory cell array; an address selection circuit, read-out circuit, and write circuit that are provided as the peripheral circuits thereof; and a timing generation circuit that controls the operations thereof.

The circuit diagram typically illustrates one word line WL, two pairs of complimentary bit lines /BL, BL, and two memory cells placed at the intersections thereof as a memory cell. The memory cell includes two CMOS inverters composed of P-channel MOSFETs Q1, Q3 and N-channel MOSFETs Q2, Q4, wherein the inputs and outputs thereof are cross-connected to form a latch circuit, and a selection switch composed of N-channel MOSFETs Q5 and Q6 that are provided between a pair of input/output nodes of this latch circuit and a pair of the bit lines /BL, BL. The gates of the MOSFET Q5, Q6 are connected to the word line WL.

In the memory cell array, 128 memory cells are arrayed on one word line WL, through not especially specified. Accordingly, the memory cell array includes 128 pairs of complimentary bit lines /BL, BL. 256 memory cells are arrayed on one pair of the bit lines /BL and BL. 256 word lines WL are provided accordingly. The pre-charge & equalizing circuit PC/EQ includes a P-channel MOSFET that supplies a pre-charge voltage to the complimentary bit lines /BL and BL and a P-channel MOSFET that short-circuits the bit line /BL and BL. This embodiment also includes a P-channel MOSFET having the gate and drain cross-connected between the bit lines /BL, BL and the power supply terminal, as a pull-up MOSFET. Thereby, the potential lowering of the bit line on the High level side can be prevented during the read-out.

The 128 pairs of bit lines are connected to 32 pairs of complimentary read-out data lines /RD, RD by a read-out column switch including P-channel MOSFETs, through not especially specified. One of the read-out data lines /RD, RD is connected to either one of four pairs of the bit lines /BL, BL. The read-out data lines /RD, RD are provided with sense amplifiers SA. The sense amplifier SA includes a CMOS latch circuit wherein inputs and outputs of two CMOS inverters composed of P-channel MOSFETs and N-channel MOSFETs are cross-connected, and N-channel MOSFETs provided between the sources of the N-channel MOSFETs of the CMOS latch circuit and the ground potential of the circuit. In correspondence with the 32 pairs of read-out data lines /RD, RD, 32 units of the sense amplifiers SA are provided in total.

Timing signals generated by the timing generation circuit and a timing control signal φsac generated by a gate circuit that receives a sense amplifier selection signal sac are transmitted through an inverter string that forms control pulses to the gates of the N-channel MOSFETs that activate the sense amplifiers SA and to the gate circuits that transmit signals amplified by the sense amplifiers SA. The timing control signal φsac is also used as a selection signal for the read-out column switch. The sense amplifier SA is activated by the selection signal and amplifies the signal on the read-out data lines /RD, RD.

The amplified signal by the sense amplifier SA is transmitted to a latch circuit LT including MOSFETs Q17 through Q22, and an output signal dout is generated by an output circuit OB. The latch circuit LT is formed with a through-latch circuit being controlled by a signal φolc generated on the basis of an output latch control signal olc. The output circuit OB includes a gate circuit controlled by a signal φodc generated on the basis of an output driver control signal odc and an output inverter.

The SRAM in this embodiment is made capable of selecting the read-out operation that activates all of the 32 sense amplifiers SA to output the read-out signal of 32-bits, the read-out operation that activates 16 units of the 32 sense amplifiers SA to output the read-out signal of 16-bits, or the read-out operation that activates 8 units of the 32 sense amplifiers SA to output the read-out signal of 8-bits, which is not especially specified. The sense amplifier selection signal sac is used for controlling the sense amplifiers SA in correspondence with the three types of the read-out operations, and it is also used as the non-selection signal for the read-out column switch including P-channel MOSFETS, by means of a read switch control signal rswc and a column selection signal sel.

The 128 pairs of bit lines are connected to 32 pairs of complimentary write data lines /WD, WD by write column switches (WCP) including N-channel MOSFETS. One of the write data lines /WD, WD is connected to any one of four pairs of the bit lines /BL, BL. The write data lines /WD, WD are provided with a write circuit (write amplifier) that includes an inverter string (WDP1) that transmits a write signal din to the write data line WD, an inverter (WDP3) that generates an inverted write signal, and an inverter string (WDP2) that transmits the inverted write signal to the write data line /WD. This write circuit is also composed of 32 units in correspondence with the 32 pairs of the complementary write data lines /WD, WD.

The SRAM in this embodiment is made capable of selecting the write operation that validates the write signal of 32-bits generated by the 32 write amplifiers, the write operation that validates the write signal of 16-bits generated by 16 units of the 32 write amplifiers, or the write operation that validates the write signal of 8-bits generated by 8 units of the 32 write amplifiers, through not especially specified. A write switch control signal wswc is used for the above write operation. The column selection signal combined with the write switch control signal wswc is transmitted to the write column switches (WCP) including N-channel MOSFETs.

The amplified signal by the sense amplifier SA is transmitted to the MOSFETs Q17 through Q22 through a gate circuit and to a latch circuit including inverters, where the output signal dout is generated through the gate circuit and the output inverter. The timing signals generated by the timing generation circuit and the timing control signal φsac generated by the gate circuit that receives the sense amplifier selection signal sac are transmitted through the inverter string that forms control pulses to the gates of the N-channel MOSFETs that activate the sense amplifiers SA and to the gate circuits that transmit the signals amplified by the sense amplifiers SA. The timing control signal φsac is also used as a selection signal for the read-out column switch.

Receiving multiple control signals such as a clock CLK, read/write control signal R/W, etc., the timing generation circuit generates various timing signals required for the operations of the SRAM in correspondence with various operation modes such as the read-out, write, and standby mode or the like.

One of the 256 word lines WL is selected by a pre-decoder and the word driver (NOR). The pre-decoder, receiving the timing signals (clock, enable) generated by the timing generation circuit and the address signal add, generates a pre-decoded signal and column selection signal. In the standby mode, all the word lines are put into the non-selected level regardless of the address signal add. The column selection signal generated by the pre-decoder is used for generating the control signals sac, rswc, wswc, etc., in correspondence with the 32-bits operation, 16-bits operation, and 8-bits operation.

The invention made by the inventors of this application being described in detail based on the preferred embodiments, this invention is not limited to these embodiments, and various changes and modifications are possible without a departure from the sprit and scope of the invention. For example, with regard to the number of the word lines and bit lines that form the memory cell arrays of the SRAM mounted on a semiconductor integrated circuit device, various configurations can be adopted. The SRAM of this invention can also be applied to an SRAM for a general-purpose memory in addition to the SRAM incorporated into a system LSI. This invention can widely be applied to the semiconductor integrated device including the above SRAMs.

What is claimed is:

1. A semiconductor integrated circuit provided with a SRAM comprising:
    a plurality of word lines;
    a plurality of complimentary bit lines;
    a plurality of static memory cells for being allocated in correspondence with the plurality of word lines and the plurality of complimentary bit lines;
    a plurality of memory cell voltage lines for supplying an operational voltage to each of the plurality of memory cells connected to the plurality of complimentary bit lines each;
    a plurality of power supply means for supplying the operational voltage to the plurality of memory cell voltage lines each;
    a pre-charge unit for supplying a pre-charge voltage corresponding to the operation voltage to the complimentary bit lines, and
    a word line selection means for selecting one of the plurality of word lines,
    wherein the memory cell voltage lines have coupling capacitances to thereby transmit a write signal of corresponding complimentary bit lines,
    wherein each of the power supply means is constructed by a resistive means,
    wherein the operational voltage is a positive potential,
    wherein the memory cells include a storage means and selection MOSFETs,
    wherein the storage means is cross-coupled inputs and outputs of two CMOS inverters,
    wherein the selection MOSFETs is arrayed between the storage means and the complimentary bit lines, and has a gate for coupling to the word line,
    wherein the resistive means includes a P-channel MOSFET having a gate supplied a ground voltage, and
    wherein the word line selection means includes:
        first and second MOSFETs of a first conductive type, connected in series between the operational voltage and an output terminal; and
        third and fourth MOSFETs of a second conductive type, connected in parallel between the ground voltage and the output terminal.

2. A semiconductor integrated circuit according to claim 1, wherein the complimentary bit lines are formed of a pair of wirings arrayed in parallel, and
    wherein the memory cell voltage lines are arrayed between the complimentary bit lines.

3. A semiconductor integrated circuit according to claim 1, wherein the gates of the first MOSFET and the third MOSFET are supplied a first control signal, wherein the gates of the second MOSFET and the fourth MOSFET are supplied a second control signal, wherein the output terminal is connected to one corresponding word line of the plurality of word lines, and wherein a word driver means is provided in which, when the word line is selected, the first and the second MOSFETS are turned ON and the third and the fourth MOSFETs are turned OFF in correspondence with the first control signal and the second control signal, to put the output terminal into a selection level corresponding to a first voltage.

4. A semiconductor integrated circuit according to claim 1, said coupling capacitances are provided between the memory cell voltage lines and the complimentary bit lines.

* * * * *